United States Patent [19]
Bashir et al.

[11] Patent Number: 5,385,861
[45] Date of Patent: Jan. 31, 1995

[54] PLANARIZED TRENCH AND FIELD OXIDE AND POLY ISOLATION SCHEME

[75] Inventors: Rashid Bashir, Santa Clara; Francois Hebert, Sunnyvale; Datong Chen, Fremont, all of Calif.

[73] Assignee: National Semiconductor Corporation, Santa Clara, Calif.

[21] Appl. No.: 213,144

[22] Filed: Mar. 15, 1994

[51] Int. Cl.$^6$ .......................................... H01L 21/76
[52] U.S. Cl. ...................... 437/67; 437/974; 437/64; 437/924; 437/984; 148/DIG. 50
[58] Field of Search ............. 437/67, 64, 68, 974, 437/924, 984; 148/DIG. 50

[56] References Cited

U.S. PATENT DOCUMENTS

| | | | |
|---|---|---|---|
| 4,396,460 | 8/1983 | Tamaki et al. | 437/67 |
| 4,551,911 | 11/1985 | Sasaki et al. | 148/DIG. 50 |
| 4,836,885 | 6/1989 | Breiten et al. | 437/67 |
| 4,876,217 | 10/1989 | Zdebel | 437/67 |
| 4,980,311 | 12/1990 | Namose | 437/67 |
| 5,006,482 | 4/1991 | Kerbaugh et al. | 437/67 |
| 5,094,972 | 3/1992 | Pierce et al. | 437/67 |
| 5,175,122 | 12/1992 | Wang et al. | 148/DIG. 50 |

FOREIGN PATENT DOCUMENTS

| | | | |
|---|---|---|---|
| 0103444 | 8/1981 | Japan | 437/67 |
| 0159258 | 7/1991 | Japan | 437/67 |

OTHER PUBLICATIONS

Kurosawa et al., *A New Bird's-Beak Free Field Isolation Technology for VLSI Devices*, International Electron Devices Meeting, Dig. Tech, Paper, pp. 384–387 (1981).
Rung et al., *Deep Trench Isolated CMOS Devices*, International Electron Devices Meeting, Digest Technical Paper, pp. 237–240 (1982).
Katsumata et al., *Sub-20 ps ECL Bipolar Technology with High Breakdown Voltage*, ESSDERC (Sep. 1993).
Lutze et al., *Electrical Limitations of Advanced LOCOS Isolation for Deep Submicrometer CMOS*, IEEE Transactions on Electron Devices, vol. 38, No. 2 (Feb., 1991).
Poon et al., *A Trench Isolation Process for BiCMOS Circuits*, IEE Bipolar Circuits and Technology Meeting 3.3 (1993).

*Primary Examiner*—Brian E. Hearn
*Assistant Examiner*—Trung Dang
*Attorney, Agent, or Firm*—Limbach & Limbach; H. Donald Nelson

[57] ABSTRACT

A novel device isolation scheme for separating active regions on a semiconductor substrate by combining field oxide formation with trench isolation is disclosed. According to this scheme, shallow and deep trenches are etched into the semiconductor substrate. A layer of nitride is deposited over the entire substrate followed by a layer of poly-silicon. Oxide spacers on the poly-silicon and a photoresist mask is aligned within the oxide spacers, thereby permitting the selective etching of the poly-silicon layer. The poly-silicon layer overlying the active regions of the semiconductor substrate are etched away. Then an oxidation step is performed such that the poly-silicon layer filling the shallow trenches is oxidized while the poly-silicon filling the deep trenches remains unoxidized. The alignment of the photoresist becomes highly non-critical because of the use of the oxide spacers and fully walled junctions are provided.

13 Claims, 4 Drawing Sheets

PLANARIZED TRENCH AND FIELD OXIDE AND POLY ISOLATION SCHEME

FIELD OF THE INVENTION

The present invention relates to an isolation process used to separate active device regions in integrated circuits. The process is particularly suitable to high density and high performance CMOS and bipolar devices.

BACKGROUND OF THE INVENTION

It is known in the prior art that individual active device regions in a semiconductor substrate may be separated from one another using a planar field oxide and a deep trench. Various field oxide isolation schemes have been proposed in the past, but many of these schemes have problems associated with "bird's beak" and "bird's head" formations. The "bird's beak" formation results from the lateral oxidation under the nitride masks used in the standard LOGOS (localized oxidation of silicon) procedure. The "bird's head" formation results from the lateral oxidation under the nitride masks used in the recessed or etch back LOCOS procedures. In fact, the walls of the recessed portions adjacent to the nitride masks, according to these procedures, greatly facilitate the lateral oxidation. These formations ("bird's beak" and "bird's head") encroach upon the active device area and thereby require greater distances between devices to compensate for this encroachment and result in a considerable reduction of packing density.

Various methods have been proposed to attempt the overcome this problem. One such method, referred to as "BOX", has been proposed by Kurosawa et al, "A New Bird's-Beak Free Field Isolation Technology for VLSI Devices", International Electron Devices Meeting, Dig. Tech. Paper, pp. 384-387 (1981). The name "BOX" has been given to this method because it involves burying oxide into etched grooves formed in silicon substrates. According to this method, the silicon substrate is etched in the field region using reactive ion etching (RIE) leaving a layer of aluminum covering the active device areas. Then, $SiO_2$ is plasma deposited over the entire substrate. The $SiO_2$ fills up the portion of the substrate previously etched away and also covers the aluminum layer.

The plasma-deposited silicon dioxide is subjected to a lift-off technique using buffered HF solution. This leaves V-shaped grooves in the periphery of the active region. The silicon dioxide on top of the aluminum mask is lifted off by etching. Then, the remaining V-shaped grooves are buried with silicon dioxide in a second step. This is accomplished by chemical vapor deposition (CVD) of silicon dioxide followed by a surface leveling technique using a spincoated resist. The resist and silicon dioxide layers are simultaneously etched by RIE. The oxide surfaces are then smoothed and any oxide remaining on the active device region must be removed by solution etching.

The problem with the BOX method is that it is too complex and cannot be performed efficiently and reliably. First of all, a two step oxide burying technique is needed, which is more time consuming than a single oxide deposition step. Furthermore, resist planarization and resist etch back steps are involved. These steps are difficult to control to close tolerances in a manufacturing environment. Resist planarization and etch-back techniques are not effective and are difficult to achieve for large active areas.

Another trench isolation method known in the prior art was disclosed in a publication by Rung et al, entitled, "Deep Trench Isolated CMOS Devices," International Electron Devices Meeting, Digest Technical Paper, pp. 237-240. According to this method, trenches are formed by RIE and are filled with silicon dioxide or poly-silicon deposited by using low pressure chemical vapor deposition (LPCVD). Once the trenches are filled, a critical etch back step must be accomplished using end point detection. After the etch back step, a capping oxidation step is performed using nitride as an oxidation mask.

Yet another method is disclosed by Katsumata et al., in "Sub-20 ps ECL Bipolar Technology with High Breakdown Voltage", ESSDERC (September 1993). In this paper, the authors disclose a shallow and deep trench isolation method using Low-Temperature Oxide Filling. According to this method, shallow and deep trenches are etched and then filled with liquid oxide deposition, a technique not yet fully established. A photoresist mask is then formed over the field areas and the exposed portions of the oxide layer are etched. Next, a second step of liquid oxide deposition is performed, followed by another etch back step. Hence, this process uses a critical alignment step and two liquid oxide deposition and etch back steps, all of which are not easily manufacturable. The above-mentioned problems with respect to large active areas apply here as well.

SUMMARY OF THE INVENTION

The present invention is directed toward a novel device isolation scheme that is applicable to high density, high performance CMOS and bi-polar processes, while overcoming the problems associated with the prior art.

According to the present invention, an isolation method for separating active regions on a semiconductor substrate by combining field oxide formation with trench isolation is disclosed. According to this scheme, shallow and deep trenches are etched into the semiconductor substrate. A layer of nitride is deposited over the entire substrate followed by a layer of poly-silicon. Oxide spacers are formed on the poly-silicon and a photoresist mask is aligned within the oxide spacers, thereby permitting the selective etching of the poly-silicon layer. The portions of the poly-silicon layer overlying the active regions of the semiconductor substrate are etched away. Then an oxidation step is performed such that the poly-silicon layer filling the shallow trenches is oxidized while the poly-silicon filling the deep trenches remains unoxidized.

One advantage of this method is that both the "Bird's Beak" and "Bird's Head" phenomena are virtually eliminated, resulting in a fully planarized surface. There is no need for employing such techniques as CMP (chemical/mechanical polishing) to arrive at a smooth surface. Another advantage is that alignment of the photoresist becomes highly non-critical because of the use of the oxide spacers. Also, fully walled junctions between the active regions and oxide regions are provided.

The use of poly-silicon is advantageous in that it is more conformal than oxide when employed to fill deep trenches and therefore is easier to use.

BRIEF DESCRIPTION OF THE DRAWINGS

FIG. 1 illustrates an etched substrate having an LTO layer deposited thereon.

FIG. 2 illustrates the structure of FIG. 1 after deep trenches and the LTO layer have been etched.

FIG. 3 illustrates the structure of FIG. 2 with a layer of pad oxide grown over the substrate and a layer of nitride deposited over the substrate.

FIG. 4 illustrates the structure of FIG. 3 with a layer of poly-silicon deposited over the entire substrate.

FIG. 5 illustrates the structure of FIG. 4 with oxide spacers provided over certain portions of the poly-silicon layer.

FIG. 6 illustrates the structure of FIG. 5 with a photoresist mask aligned on top and within the width of the oxide spacers.

FIG. 6 illustrates the structure of FIG. 6 after the polysilicon has been etched.

FIG. 8 illustrates the structure of FIG. 7 after the polysilicon and oxide spacers have been etched and after the poly-silicon layer has been oxidized and converted into oxide.

FIG. 9 illustrates the structure of FIG. 8 after the nitride layer has been etched and the pad oxide removed.

DETAILED DESCRIPTION OF THE PREFERRED EMBODIMENTS

The present invention describes a novel device isolation scheme that is applicable to high density, high performance CMOS and bipolar processes.

According to the present invention, field oxide formation is combined with trench isolation. The trench is filled with poly-silicon in a manner such that no etch back is required. The poly-silicon is planarized by oxidation. This is a self-limiting oxidation because a nitride layer prevents any oxidation beyond a certain point. Furthermore, the isolation scheme provides fully walled junctions between the active regions and oxide regions.

An isolation scheme according to a preferred embodiment of the present invention will now be discussed with respect to FIGS. 1–9.

Figure 1:
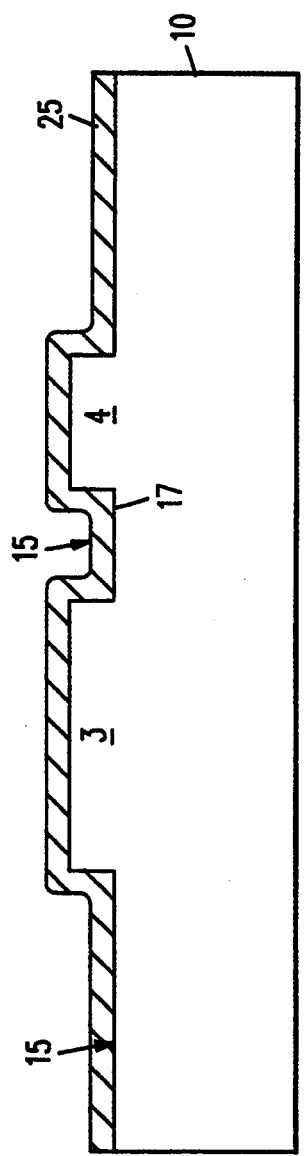
FIGS. 1–9 illustrate an isolation scheme according to the present invention. The specific steps in the scheme are illustrated in each figure as follows.

As shown in FIG. 1, shallow trenches 15 are etched in non-active regions in a substrate 10 (preferably a silicon wafer) by using a photoresist mask that defines active regions 3 and 4. Preferably, the trench is 1 micrometer deep. Next, a low temperature deposited oxide layer (LTO) 25 is deposited over the entire substrate 10 to be used as a mask for a subsequent trench etch. LTO 25 preferably has a thickness of 7000 Angstroms, but any thickness in the range of 4000 to 7000 Angstroms would be suitable.

Figure 2:
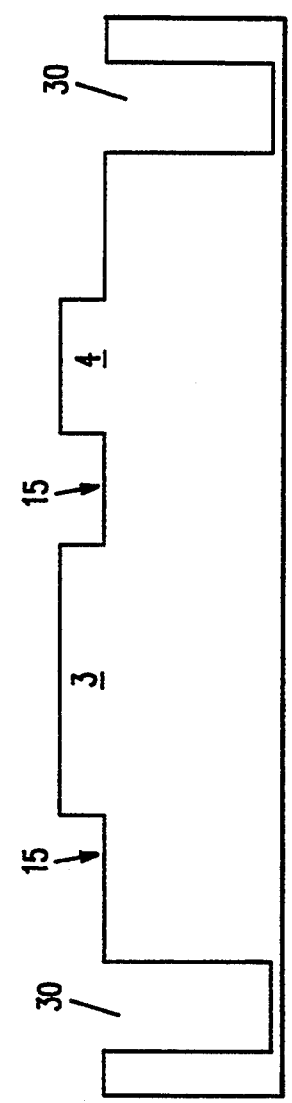

As shown in FIG. 2, deep trenches 30 are etched into substrate 10 by using the LTO mask to designate trench locations. Deep trenches may be etched by using a magnetically enhanced RIE (reactive ion etching) system. Suitable chemistries usable in this process include: $SF_6+Cl_2$, $Cl_2$, and $CF_4+Cl_2$. FIG. 2 shows substrate 10 after the LTO has been stripped. The depth of the deep trenches 30 depends upon intended applications and is easily variable.

Figure 3:
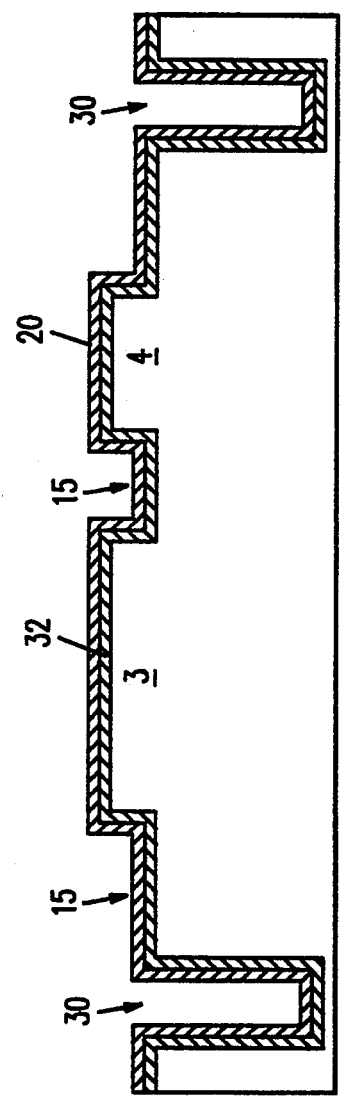

Next, a layer of pad oxide 32 (approximately 500 Angstroms thick) is grown over the entire substrate as shown in FIG. 3. Subsequently, a layer of nitride 20 (approximately 1000 Angstroms thick) is deposited over the layer of pad oxide 32 by using chemical vapor deposition (CVD).

Figure 4:
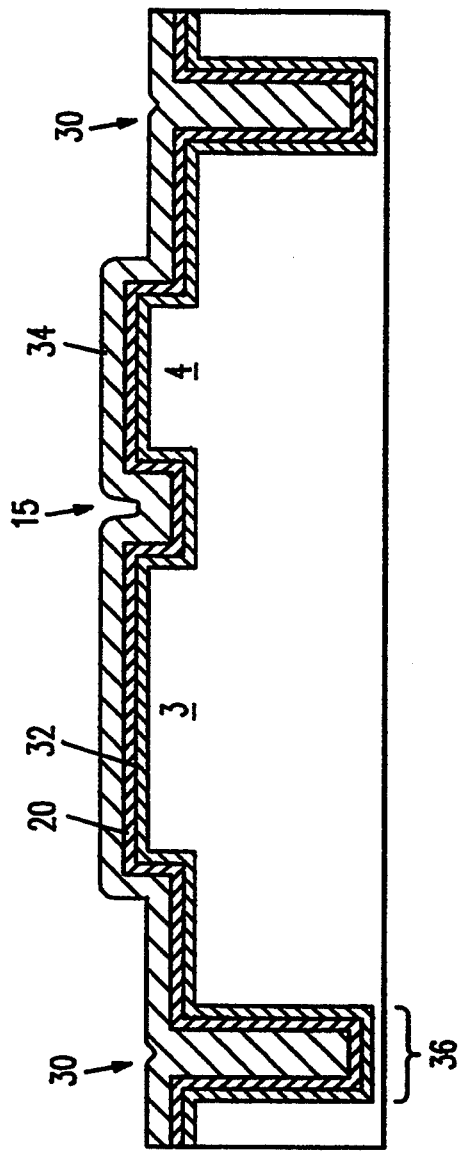

As shown in FIG. 4, a poly-silicon layer 34 is then deposited over the nitride layer 20. The poly-silicon layer 34 is preferably about half the thickness of the ultimately desired field oxide and is deposited so that it fills trenches 30. These trenches have a width 36 of approximately 1 micrometer.

Figure 5:
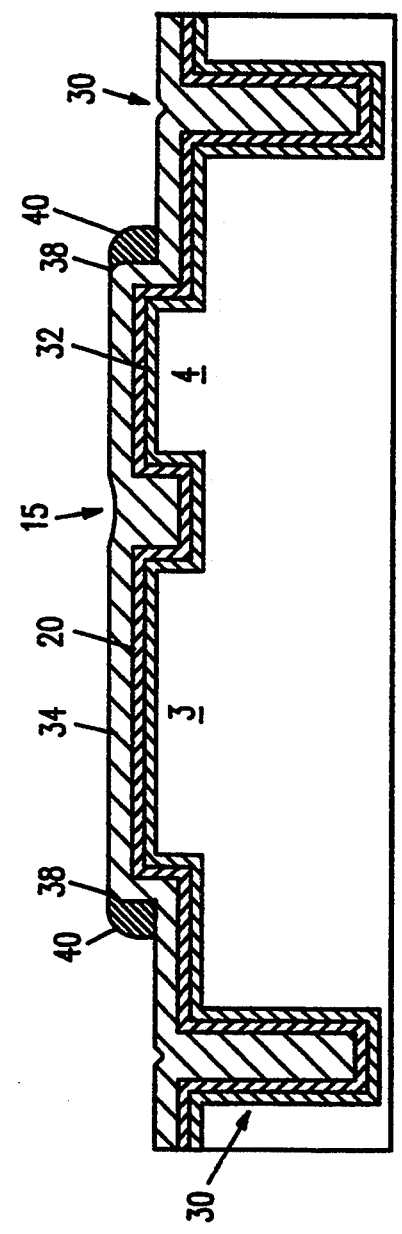

Next, oxide is deposited over the substrate. The oxide is etched using a reactive ion etching (RIE) process to form oxide spacers 40. The spacers 40 are formed on shoulder regions 38 of the poly-silicon layer 34 as shown in FIG. 5. The width of the spacers 40 must be sufficient to satisfy the alignment tolerances of the photoresist mask used in the subsequent step. A width of 1 micrometer is preferred, but anywhere in the range of 1 to 1.5 micrometers would be suitable. The spacers 40 are laterally displaced from the active regions 3 and 4 by a distance approximately equal to the thickness of the polysilicon layer 34.

Figure 6:
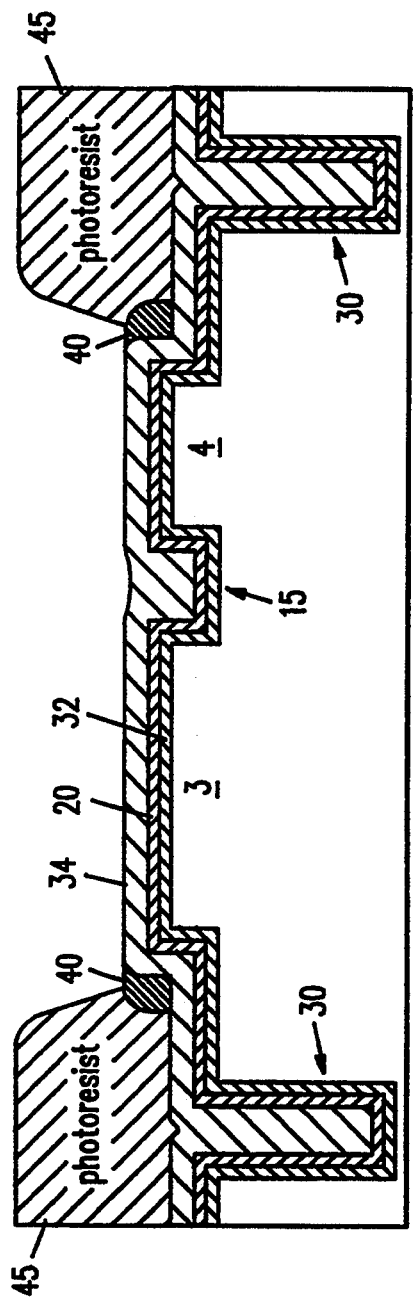
Figure 7:
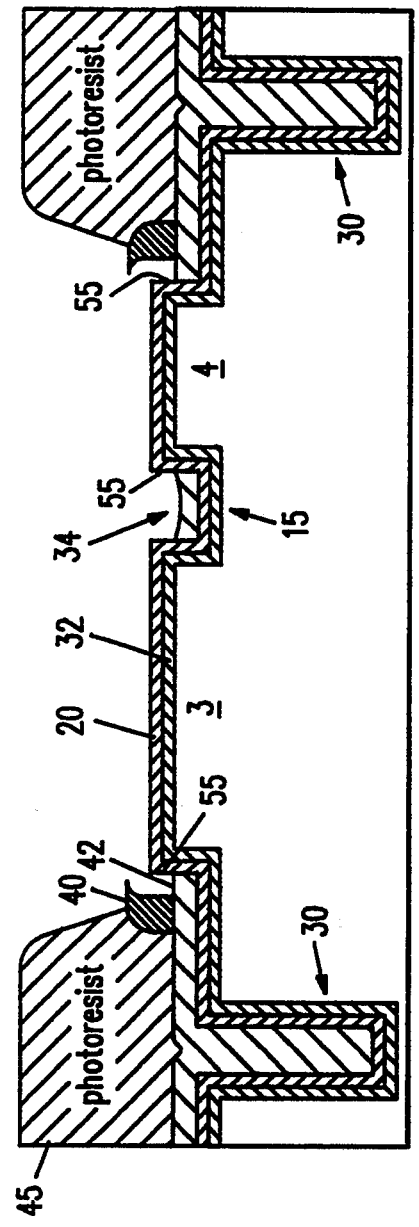

As shown in FIG. 6, a photoresist mask 45 is defined to be aligned within the oxide spacers 40. An isotropic RIE poly-silicon etch which is selective to oxide and nitride is then performed using the photoresist mask 45, resulting in the removal of a portion of poly-silicon layer 34 overlying active regions 3 and 4, as shown in FIG. 7. The poly-silicon in any of the shallow trenches 15 within spacers 40 is etched back so as to leave poly-silicon at a thickness of 0.5 micrometers, representing a thickness that is half of the ultimately desired oxide thickness. Active regions 3 and 4 are protected by the nitride layer 20. Also, spacers 40 act as a self-aligned mask permitting the poly-silicon next to spacers 40, such as at point 42, to be etched and thereby resulting in a planar field oxide relative to active regions 3 and 4. Also, walls 55 of active regions 3 and 4 are fully covered with oxide, without any encroachment into these active regions.

Figure 8:
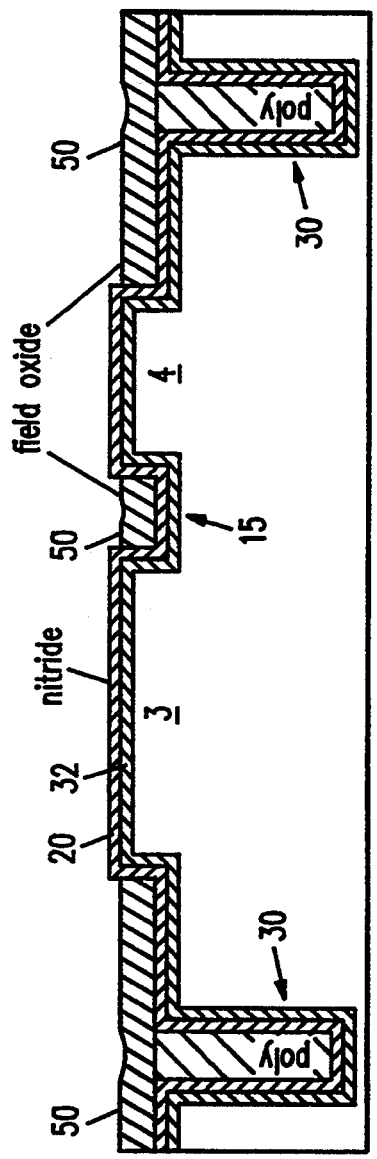

Then, photoresist 45 is removed and oxide spacers 40 are etched by using a wet etch, resulting in the structure illustrated in FIG. 8. Then, the polysilicon layer 34 is oxidized to convert the poly-silicon into oxide. This oxidation is limiting in that the nitride layer 20 overlying the active regions and on the sidewalls of the trenches, prevents oxidation at those sites. As a result, it is easier to achieve a planarized field oxide layer that is not suspectable to "birds head" or "birds beak" phenomenon. Also, the oxidation is controlled such that most of the polysilicon within trenches 30 remains unoxidized.

Figure 9:
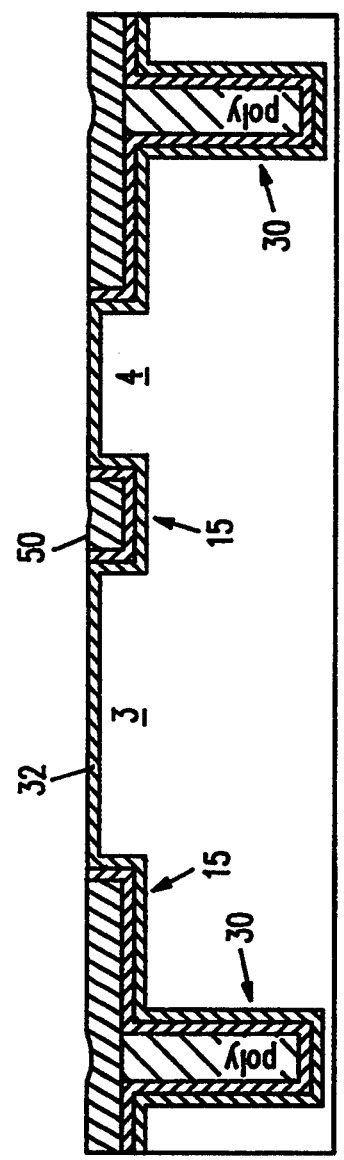

Finally, as shown in FIG. 9, nitride layer 20 is etched off from the top of active regions 3 and 4. This etch should be selective to oxide. Then, the layer of pad oxide 32 can be removed so that subsequent processing of the resulting structure can be continued. In particular, this structure is now provided with planarized oxide regions and poly-silicon filled trenches that permit device isolation.

It is important to note that the step of etching the deep trench 30 may be omitted entirely, resulting in planar, fully walled oxide isolation regions. Trench isolation can then be performed using conventional processes.

While the present invention has been disclosed above with particular reference to the preferred embodiments shown, those embodiments are presented by way of example, not by way of limitation. Those of ordinary skill in the art would be enabled by this disclosure to add to or to modify these embodiments in various ways as needed and still be within the scope and spirit of the present invention as recited in the appended claims.

What is claimed is:

1. An isolation method for separating active regions on a semiconductor substrate by combining field oxide formation with trench isolation, the isolation method comprising the steps of:
   etching shallow trench regions on the semiconductor substrate;
   etching deep trenches in the substrate in selected portions of the shallow trench regions;
   depositing a layer of pad oxide over the entire substrate;
   depositing a layer of nitride over the layer of pad oxide;
   depositing a layer of poly-silicon over the nitride layer;
   forming oxide spacers on the poly-silicon;
   aligning a photoresist mask, using the oxide spacers, to permit the selective etching of the poly-silicon layer, wherein the selective etching of the poly-silicon layer includes etching of a portion of the poly-silicon layer that overlies the active regions on the semiconductor substrate;
   removing the photoresist mask and the oxide spacers; and
   oxidizing the poly-silicon layer such that only the poly-silicon filling the shallow trenches is oxidized while a portion of the poly-silicon filling the deep trenches remains unoxidized.

2. The method according to claim 1, wherein the nitride layer is deposited using chemical vapor deposition.

3. The method according to claim 2, wherein the shallow trench has a depth, the depth being equal to 1.0 micrometer.

4. The method according to claim 3, wherein the oxide spacers are formed by using a reactive ion etching process.

5. The method according to claim 4, wherein the poly-silicon is selectively etched using an isotropic RIE etch which is selective to oxide and nitride.

6. The method according to claim 5, wherein the poly-silicon existing in the shallow trenches is etched to a depth of 0.5 micrometers.

7. The method according to claim 6, wherein the spacers are laterally displaced from the active regions by a distance approximately equal to the thickness of the poly-silicon layer.

8. An isolation method for separating active regions on a semiconductor substrate by combining field oxide formation with trench isolation, the isolation method comprising the following steps performed in the following order:
   etching shallow trench regions on the semiconductor substrate;
   depositing a layer of pad oxide over the entire substrate;
   depositing a layer of nitride over the layer of pad oxide;
   depositing a layer of poly-silicon over the nitride layer;
   forming oxide spacers on the poly-silicon;
   aligning a photoresist mask, using the oxide spacers, to permit the selective etching of the poly-silicon layer, wherein the selective etching of the poly-silicon layer includes etching of a portion of the poly-silicon layer that overlies the active regions on the semiconductor substrate;
   removing the photoresist mask and oxide spacers; and
   oxidizing the poly-silicon layer.

9. The method according to claim 8, further comprising the step of etching deep trenches after the step of etching shallow trench regions has been accomplished and before the step of depositing a layer of pad oxide is performed, wherein the step of depositing a layer of poly-silicon fills the deep trenches with poly-silicon and wherein the step of oxidizing the poly-silicon layer oxidizes a portion of the poly-silicon filling the deep trenches.

10. The method according to claim 9, wherein the shallow trench has a depth, the depth being equal to 1.0 micrometer.

11. The method according to claim 10, wherein the poly-silicon is selectively etched using an anisotropic RIE etch which is selective to oxide and nitride.

12. The method according to claim 11, wherein the poly-silicon existing in the shallow trenches is etched to a depth of 0.5 micrometers.

13. The method according to claim 12, wherein the spacers are laterally displaced from the active regions by a distance approximately equal to the thickness of the polysilicon layer.

* * * * *